(12) United States Patent
Keyser et al.

(10) Patent No.: US 11,374,376 B2
(45) Date of Patent: Jun. 28, 2022

(54) WAVELENGTH FLEXIBILITY THROUGH VARIABLE-PERIOD POLING OF A COMPACT CYLINDRICAL OPTICAL FIBER ASSEMBLY

(71) Applicant: US Govt as represented by Secretary of Air Force, Wright-Patterson AFB, OH (US)

(72) Inventors: Christian Keyser, Shalimar, FL (US); Trevor Courtney, Niceville, FL (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 224 days.

(21) Appl. No.: 16/986,408

(22) Filed: Aug. 6, 2020

(65) Prior Publication Data

US 2021/0013690 A1    Jan. 14, 2021

Related U.S. Application Data

(63) Continuation of application No. 16/920,994, filed on Jul. 6, 2020.

(Continued)

(51) Int. Cl.
*H01S 3/038* (2006.01)
*G02B 6/02* (2006.01)
(Continued)

(52) U.S. Cl.
CPC .......... *H01S 3/0385* (2013.01); *G02B 6/0005* (2013.01); *G02B 6/02328* (2013.01);
(Continued)

(58) Field of Classification Search
CPC ..................................... H01S 5/1234
See application file for complete search history.

(56) References Cited

U.S. PATENT DOCUMENTS

| | | | | |
|---|---|---|---|---|
| 5,058,970 A | * | 10/1991 | Schildkraut | ........... G02F 1/3775 359/332 |
| 6,873,753 B2 | * | 3/2005 | Kaneko | .................... G02B 6/13 65/421 |

(Continued)

OTHER PUBLICATIONS

J. Sun, Y. Wu, X. Xi, Y. Zhang, X. Wu and L. Qu, "A novel compensation method of damping asymmetry based on piezoelectric electrodes for cylindrical resonators," 2018 IEEE International Symposium on Inertial Sensors and Systems (INERTIAL), 2018, pp. 1-4, doi: 10.1109/ISISS.2018.8358131. (Year: 2018).*

(Continued)

*Primary Examiner* — Rhonda S Peace
(74) *Attorney, Agent, or Firm* — AFMCLO/JAZ; David E. Franklin (57) ABSTRACT

A cylindrical electrode module of a fiber optic laser system includes an inner cylinder having an inner repeating pattern of longitudinally-aligned positive and negative electrodes on an outer surface of the inner cylinder. The cylindrical electrode mode includes an outer cylinder that encloses the inner cylinder. The outer cylinder that has an outer repeating pattern of longitudinally-aligned negative and positive electrodes on an inner surface of the inner cylinder that are in corresponding and complementary, parallel alignment with the positive and negative electrodes of the inner repeating pattern on the outer surface of the inner cylinder. The cylindrical electrode module includes an optical fiber having an input end configured to align with and be optically coupled to a high power pump laser. The optical fiber is wrapped around the inner cylinder within the outer cylinder (Continued)

to form a cylindrical fiber assembly. The electrodes are activated to achieve quasi-phase matching.

14 Claims, 7 Drawing Sheets

Related U.S. Application Data (60) Provisional application No. 62/872,316, filed on Jul. 10, 2019.

(51) Int. Cl.
*H01S 5/10* (2021.01)
*F21V 8/00* (2006.01)
*G02B 6/42* (2006.01)

(52) U.S. Cl.
CPC .......... *G02B 6/4296* (2013.01); *H01S 5/1003* (2013.01); *C03B 2203/16* (2013.01); *C03B 2203/42* (2013.01)

(56) References Cited

U.S. PATENT DOCUMENTS

| | | | | |
|---|---|---|---|---|
| 10,915,024 B2* | 2/2021 | Hwang | ............... | H01L 21/0272 |
| 2007/0280304 A1* | 12/2007 | Deile | ................... | H01S 3/0975 372/6 |
| 2021/0013690 A1* | 1/2021 | Keyser | ................. | G02F 1/3548 |
| 2021/0088718 A1* | 3/2021 | Keyser | ................. | G02F 1/3548 |

OTHER PUBLICATIONS

T. Courtney, C. Chester and C. Keyser, "Efficient Quasi-Phase Matched Xe-Filled Hollow-Core Fiber OPA," 2020 IEEE Research and Applications of Photonics in Defense Conference (RAPID), 2020, pp. 1-2, doi: 10.1109/RAPID49481.2020.9195692. (Year: 2020).*

* cited by examiner

WAVELENGTH FLEXIBILITY THROUGH VARIABLE-PERIOD POLING OF A COMPACT CYLINDRICAL OPTICAL FIBER ASSEMBLY

CROSS-REFERENCE TO RELATED APPLICATIONS

This application is a continuation under 35 U.S.C. § 120 to U.S. patent application Ser. No. 16/920,994 entitled "Wavelength Flexibility Through Variable-Period Poling of Fluid-Filled Hollow-Core Photonic Crystal Fiber," filed 6 Jul. 2020, which in turn claimed the benefit of priority under 35 U.S.C. § 119(e) to U.S. Provisional Application Ser. No. 62/872,316 entitled "Wavelength Flexibility Through Variable-Period Poling of Fluid-Filled Hollow-Core Photonic Crystal Fiber," filed 10 Jul. 2019, the contents of all of which are incorporated herein by reference in their entirety.

The invention described herein was made by employees of the United States Government and may be manufactured and used by or for the Government of the United States of America for governmental purposes without the payment of any royalties thereon or therefore.

ORIGIN OF THE INVENTION

BACKGROUND

1. Technical Field

The present disclosure generally relates to fiber laser systems, and more particularly to wavelength adjustable fiber laser systems.

2. Description of the Related Art

Applications exist for laser communication, sensing, and designating that benefit from being operable in more than one frequency. However, providing more than one laser each operable in respective frequencies can be prohibitive in cost, size, weight and power (CSWAP). Alternatively, it is generally known that wavelength conversion of a single laser can be achieved with nonlinear crystals by nonlinear optical processes such as sum frequency and difference frequency generation or more specifically with optical parametric generation (OPG), optical parametric amplification (OPA), and optical parametric oscillation (OPO). However, efficient operation of typical processes are believed to require housing of the nonlinear crystal in an optical cavity external to the pump laser, which seem to function near optical damage threshold and are opto-mechanically sensitive. Thus, this alternative is also CSWAP prohibitive. Dynamic wavelength agility can be achieved by pump power modulation above and below the nonlinear process operational threshold or by using a phase modulator to change the pump polarization state such that the requisite phase matching conditions are inhibited.

In optical parametric generation (OPG), a high power pump laser is shined through a nonlinear medium with a second order nonlinearity ($\chi^2$). OPG is also referred to as difference frequency generation. Optical parametric amplification (OPA) is similar to OPG. OPA uses a high power pump that is shined in along with a weak seed laser. The seed can be either the corresponding signal or idler wavelength. The seed is generated while the complimentary signal or idler is generated. If the phase matching condition (photon conservation of momentum) is met and sufficient pump power is used, the OPA process can be used to generate two longer wavelength photons called the signal (shorter or desired wavelength) and idler (longer wavelength). The phase matching condition is often met by sending the pump laser through a $\chi^2$ nonlinear crystal in a very specific direction and with a specific polarization. This technique is called birefringence phase matching.

Although this technique enables OPA operation the efficiency is sometimes lower than ideal because the conditions for phase matching usually come at the cost of directing the laser beam through the crystal in a direction for which the nonlinearity is low, the crystals are short, and the crystals can only be exposed to a limited pump power before damage.

To remedy this problem another technique called quasi-phase matching (QPM) is used to simultaneously achieve phase matching and high nonlinearity. The crystal nonlinearity is modified by applying a periodic high voltage to the crystal. At high enough voltage, this process produces a permanent periodic inversion of the crystal polarization. The poling period is chosen to enable phase matching for a specific signal wavelength. The process is permanent and the crystal can only be used to produce a specific wavelength. Although an effective solution to low nonlinearity, the periodically poled crystals are relatively short and sensitive to optical damage since they require very high pump intensity. Also, this technique requires the addition of free space optics to couple the pump laser to the crystal. If reduced pump power is required then the crystal has to be placed in an optical cavity.

A fiber based solution is based on gas or liquid filled hollow-core photonic crystal fiber (HCPCF) and solid core fibers. $\chi^2$ is typically negligible for glass, gases and liquids due to the random molecular orientations; the media is centrosymmetric and lacks a significant chi-2 value. However, application of an electric field to a glass, gas, or liquid can induce an effective $\chi^2$. So if the gas-filled HCPCF is sandwiched between two electrodes with a voltage applied to the electrodes, a $\chi^2$ will be induced but the phase matching condition will likely not be met. Pressure tuning the gas along with the fiber properties enables some level of control over the phase matching conditions and may enable higher order modes to be phase matched. This is unattractive because the higher modes will yield lower conversion efficiency and yield a poor beam quality laser emission.

An alternative is to enable quasi-phase matching by applying a periodic electric field along the length of the gas filled HCPCF similar to periodically poled niobate. The field will induce a χ2 and proper poling period will enable phase matching of the fundamental modes. This was proposed in 2016 (Broadband electric-field-induced LP01 and LP02.second harmonic generation in Xe-filled hollow-core PCF) by JEAN-MICHEL MENARD, but an enabling method to implement was not contemplated or disclosed.

SUMMARY

The present innovation overcomes the foregoing problems and other shortcomings, drawbacks, and challenges of wavelength adjustable fiber laser systems by providing a compact method of quasi-phase matching in optical fibers. While the present innovation will be described in connection with certain embodiments, it will be understood that the invention is not limited to these embodiments. To the contrary, this invention includes all alternatives, modifications, and equivalents as may be included within the spirit and scope of the present invention.

According to one aspect of the present innovation, a cylindrical electrode module of a fiber optic laser system includes an inner cylinder having an inner repeating pattern of longitudinally-aligned positive and negative electrodes on an outer surface of the inner cylinder. The cylindrical electrode mode includes an outer cylinder that encloses the inner cylinder. The outer cylinder that has an outer repeating pattern of longitudinally-aligned negative and positive electrodes on an inner surface of the inner cylinder that are in corresponding and complementary, parallel alignment with the positive and negative electrodes of the inner repeating pattern on the outer surface of the inner cylinder. The cylindrical electrode module includes an optical fiber having an input end configured to align with and be optically coupled to a high power pump laser. The optical fiber is wrapped around the inner cylinder within the outer cylinder to form a cylindrical fiber assembly. The electrodes are activated to achieve quasi-phase matching.

According to another aspect of the present innovation, a fiber laser system includes a high power pump laser, a cylindrical electrode module, and a controller. The cylindrical electrode module includes an inner cylinder having an inner repeating pattern of longitudinally-aligned positive and negative electrodes on an outer surface of the inner cylinder. An outer cylinder encloses the inner cylinder and that has an outer repeating pattern of longitudinally-aligned negative and positive electrodes on an inner surface of the inner cylinder that are in corresponding and complementary, parallel alignment with the positive and negative electrodes of the inner repeating pattern on the outer surface of the inner cylinder. An optical fiber has: (i) an output end; and (ii) an input end aligned with and optically coupled to the high power pump laser. The optical fiber is wrapped around the inner cylinder within the outer cylinder to form a cylindrical fiber assembly, the output end extending out of the outer cylinder. The controller is communicatively coupled to, and activates, the inner repeating pattern of positive and negative electrodes and the outer repeating pattern of negative and positive electrodes to perform adjustable period poling to achieve QPM with wavelength agility in a compact form factor.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

According to aspects of the present invention, wavelength flexibility through variable-period poling, or variable period quasi-phase matching (QPM), of fibers, including liquid or gas-filled hollow-core photonic crystal fiber (HCPCF) and solid core fibers, enables wavelength flexibility in a fiber based laser system for applications such as communications, three-dimensional laser scanning ("LADAR"), military illuminators, beacons, and designators. In particular, applying different poling periods around the fiber enables rapid wavelength agility. In one or more embodiments, the fiber based laser system is one or more of: (i) a simple, small, low cost and efficient; (ii) opto-mechanically insensitive to misalignment; and (iii) exhibit rapid wavelength switching; and (iv) provide considerable flexibility in wavelength selection.

In one or more embodiments, the present innovation uses solid core fibers. In one or more embodiments, the present innovation uses gas or liquid filled fibers. In one or more embodiments, the present innovation uses temporarily gas or liquid filled fibers. In one or more embodiments, aspects of the present innovation provide periodic poling of a gas/liquid filled hollow core fiber or solid core fiber with dynamically adjustable poling period to enable wavelength flexibility. In contrast to the crystal, the effect of the poling will not be permanent; once the field is turned off the molecules will relax and there will be no optical axis. Thus, an optical parametric amplification (OPA) process can be turned on and off by turning the electrode voltage on and off If the electrode period can be dynamically changed, the OPO process can enable the phase matching condition to be met for different signal and idler wavelengths.

In one aspect, the present disclosure provides dynamic wavelength agility. The ability to dynamically change wavelength is achieved by energizing different electrodes where different electrodes have different periods. Each period is designed to produce a particular wavelength. In one or more embodiments, a second technique uses a single electrode poling period with modulating power to the electrodes. So when there is no power you get the pump wavelength out and when there is a voltage applied to the electrode you get the design wavelength.

The present innovation has a number of applications that include optical parametric generation (OPO), optical parametric amplification (OPA), and optical parametric oscillation (OPO). In OPG, the input is one light beam of frequency $\omega_p$, and the output is two light beams of lower frequencies $\omega_s$ and $\omega_i$, with the requirement $\omega_p = \omega_s + \omega_i$. These two lower-frequency beams are called the "signal" and "idler", respectively. This light emission is based on the nonlinear optical principle. The photon of an incident laser pulse (pump) is divided into two lower-energy photons. The wavelengths of the signal and the idler are determined by the phase matching condition. The wavelengths of the signal and the idler photons can be tuned by changing the phase matching condition.

In one aspect, the present innovation provides wavelength flexibility—reconfigurable electrodes to produce different periods or multiple period electrodes around the fiber. Generally-known approaches are limited to solid core fibers and use a planar ground electrode and not a periodic electrode of oppose polarity on either side of the fiber. The generally-known approach only achieved a conversion efficiency of about 0.1% and only focused on second harmonic generation. By using periodic electrodes of opposite polarity opposed to one another, our OPA is anticipated to have a conversion efficiency of approximately 30% based on modeling. The SHG and OPA process are similar enough that one can directly compare the efficiencies. Also, we propose using additive manufacturing or lithography techniques for electrode production to enable very short periods—as short at microns for lithography or ~10's of microns for additive manufacturing. The generally-known approaches use printed circuit board with electrode period of ~1.5 mm. This short period forces them to work at low pressure where nonlinearity chi-2 is low. Highest chi-2 occurs at highest pressure which requires shortest electrode period. Although some generally-known approaches use QPM, there was no suggestion of dynamic wavelength flexibility.

Figure 1:
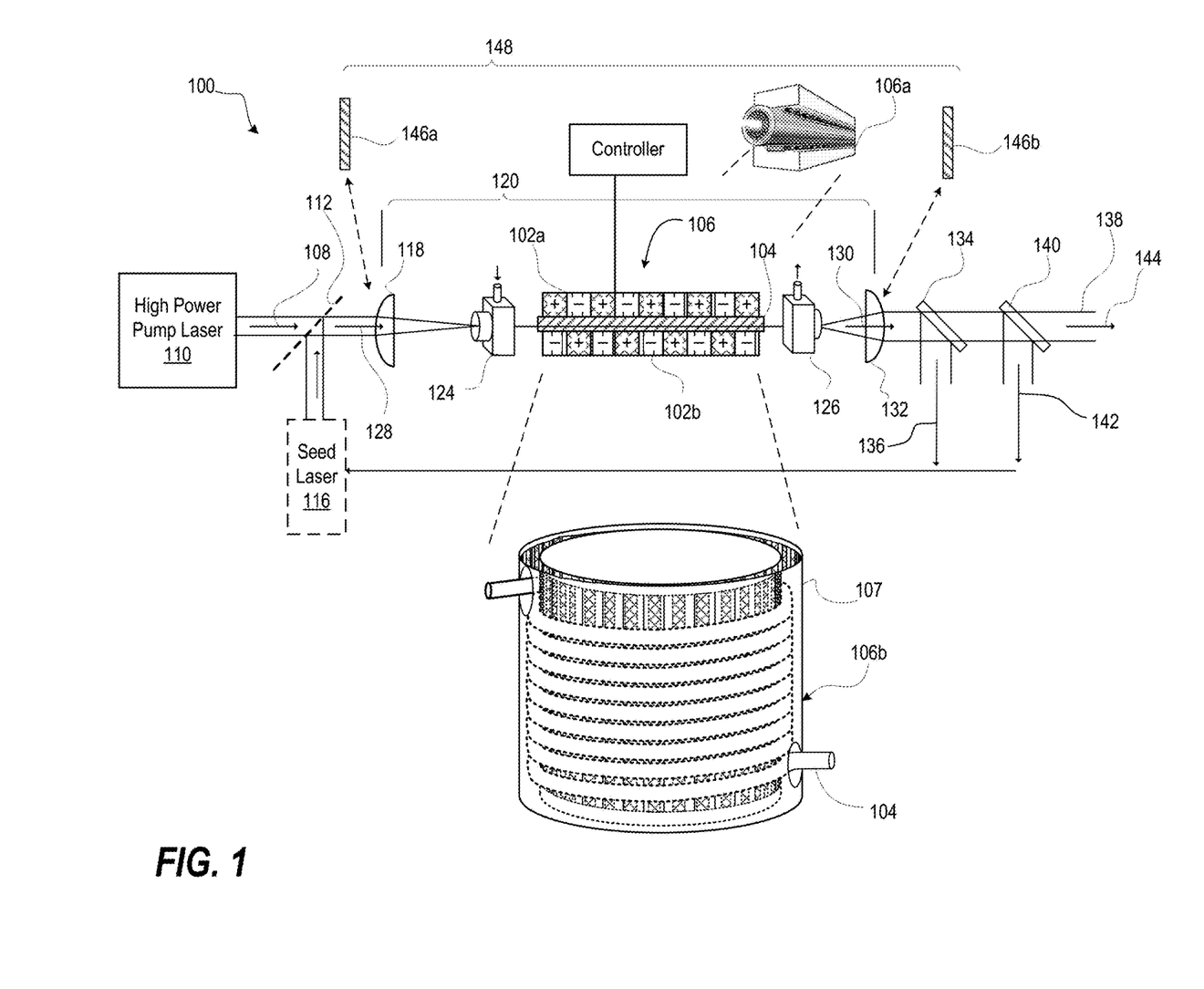
FIG. 1 depicts a fiber laser system that dynamically changes signal wavelength of , according to one or more embodiments.

FIG. 1 depicts a diagram of a fiber laser system 100 that provides dynamic wavelength agility by configuring paired periodic electrodes 102a-102b positioned on opposite sides of an optical fiber 104 provide a fiber assembly 106 for adjusting quasi-phase matching. In one or more embodiments, the paired periodic electrodes 102a-102b and optical fiber 104 are arranged in a linear fiber assembly 106a. In addition, the electrode period at different azimuthal angles along the cylinder are different-the phase matched wavelengths will vary depending on which electrode is powered. The poling period necessary to achieve phase matching for a particular signal wavelength is a function of the pump wavelength, desired signal/idler wavelengths, fiber design and effective modal index of refraction. For a gas-filled fiber, pressure can be used to tune the modal index of refraction. In one or more embodiments, the paired periodic electrodes 102a-102b and optical fiber 104 are arranged in a cylindrical fiber assembly 106b. In one or more embodiments, the fiber 104 is 250 µm in diameter and is wrapped within a cylindrical electrode 107 is approximately 300 µm and encases the fiber 104 to form a cylindrical fiber assembly 106b.

In one or more embodiments, the fiber laser system 100 is configured as an OPA with a pump output 108 from a high power pump laser 110 being combined by a dichroic mirror or fiber combiner ("combiner") 112 with a seed output 114 from a seed laser 116. The seed output 114 can have a signal wavelength or an idler wavelength. The combiner 112 directs the pump output 108 and the seed output 114 in a single direction for coupling to the fiber assembly 106 via a first lens 118 at one end of an optical cavity 120 that contains the fiber assembly 106. In one or more embodiments, the optical fiber 104 of the fiber assembly 106 has a solid core. In one or more embodiments, the optical fiber 104 of the fiber assembly 106 is has a hollow core that is filled with a fluid comprising one or more of a gas and a liquid. In one or more embodiments, the hollow core of the optical fiber 104 is encapsulated between an input gas cell 124 and an output gas cell 126 that include a window respectively to receive combined input 128 to and direct output 130 from the fiber assembly 106. A collimation lens 132 collimates the output 130. A first output dichroic mirror 134 separates residual pump laser 136 from beam path 138. A second output dichroic mirror 140 separates residual idler laser 142 from beam path 138. In one or more embodiments, the seed laser 116 receives residual pump laser or 136 residual idler laser 142. What remains in beam path 138 is laser output signal beam 144. In an exemplary embodiments, the pump laser 110 produces pump output 108 having a wavelength of 1.06 which results in residual idler laser 142 of wavelength 3.1 µm and laser output signal beam 144 of wavelength 1.6 µm.

In one or more alternative embodiments, the fiber laser system 100 includes two mirrors 146a-146b that define a mirror cavity 148 to operate as an optical parametric oscillator (OPO). The OPO employs the same fundamental nonlinear process, difference frequency generation, as is used for the OPA. The difference is that the nonlinear medium (here the quasi-phase matched) of fiber assembly 106 is part of the optical cavity 120 that serves to reduce pump power threshold and increase conversion efficiency. Mirrors 1146a-146b reflect the signal wavelength with high reflectivity so that the signal wavelength oscillates in the mirror cavity 148. This reduces threshold pump power and increases efficiency. Neither the pump nor the idler oscillate but leak out instead.

Figure 2A:
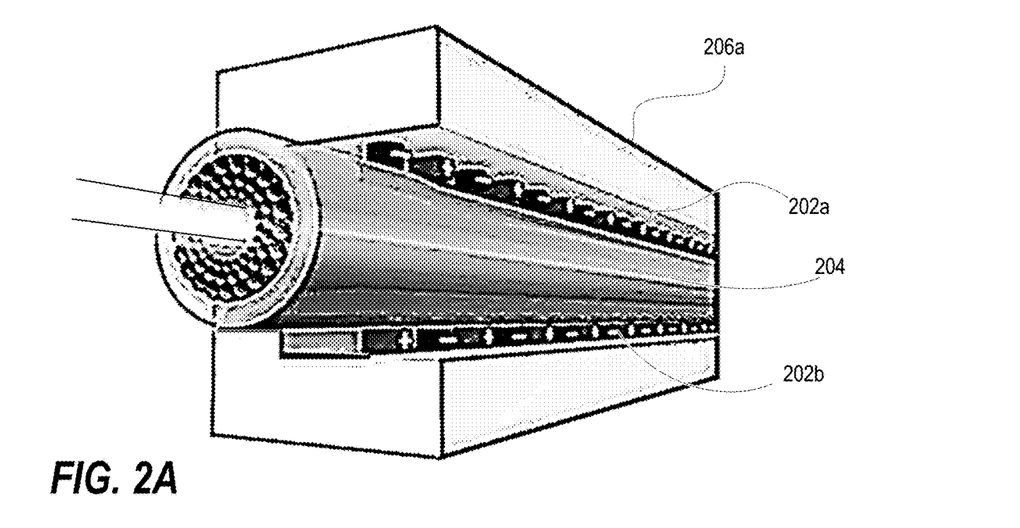
FIG. 2A is an isometric diagram illustrating a gas or fluid-filled hollow-core photonic crystal fiber (HCPCF) with orthogonally opposed, periodic electrode structure, according to one or more embodiments.

FIG. 2A depicts a linear fiber assembly 206a that includes gas/liquid-filled HCPCF 204 with periodic electrode structure or set 202a-202b enabling QPM OPA laser generation. Reconfigurable electrodes could be constructed by making the electrodes much smaller than the necessary period for phase matching and dynamically grouping electrodes to produce the desired periods. Integrated circuit techniques could be employed to dynamically group electrodes. The electrode structure could be produced through lithography or additive manufacturing techniques depending on the required periods.

Figure 2B:
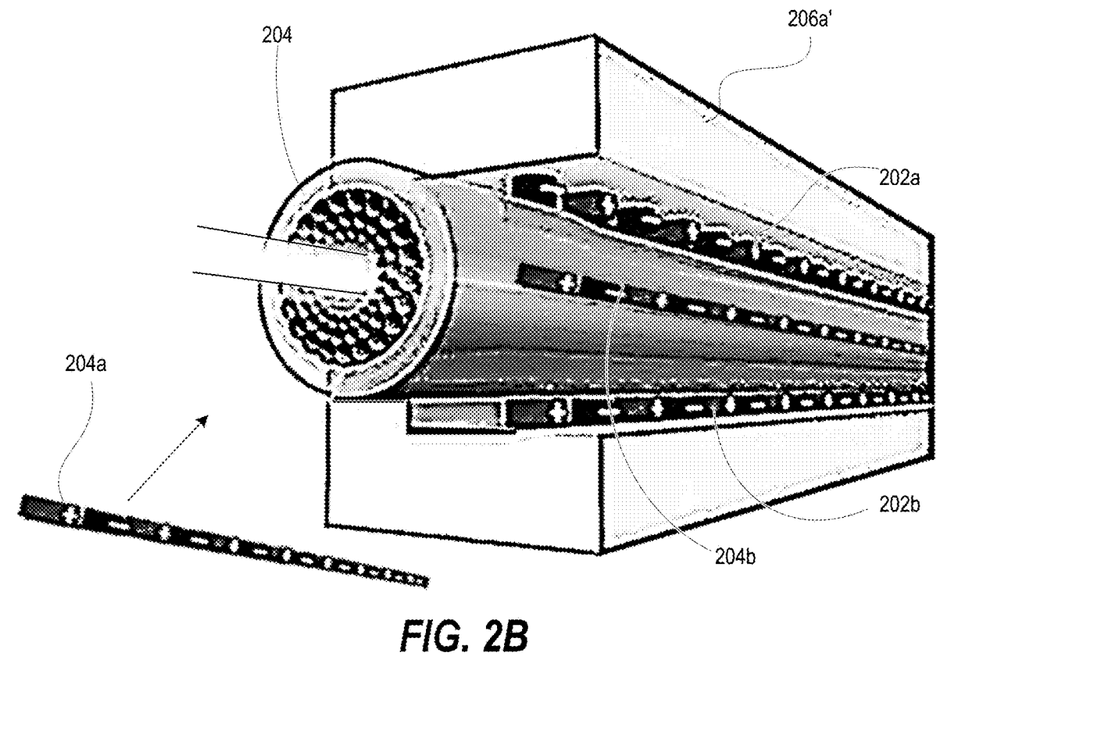
FIG. 2B is an isometric diagram illustrating the gas or fluid-filled HCPCF of FIG. 1 with a second pair of orthogonally opposed, periodic electrode structure that is orthogonal to the first pair, according to one or more embodiments.

FIG. 2B depicts an alternative design of a linear fiber assembly 206a' that includes gas/liquid-filled HCPCF 204 gas/liquid-filled HCPCF 200b that employs two orthogonal electrode sets or patterns 202a-202b, 204a 204b. In one or more embodiments, electrode sets or patterns can be used that are at angles that are not orthogonal to each other. The poling period of the top and bottom electrode pattern 202a-202b respectively has a different poling period than the orthogonal right and left electrode pattern 204a-204b. By switching voltage between top and bottom electrode pattern 202a-202b and right and left electrode pattern 204a-204b quasi-phase matching is achieved at two different signal wavelengths. In addition, one could rotate this electrode structure around the fiber such that at different azimuth angles there are different electrode periods which phase match different wavelengths.

Figure 3A:
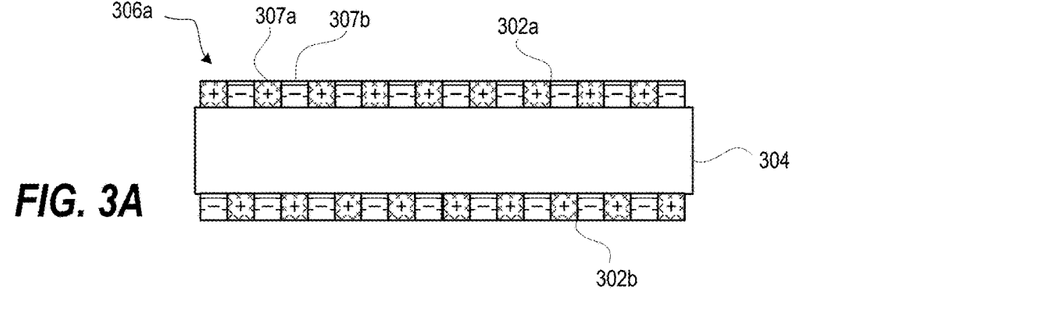
FIG. 3A depicts a diagrammatic side view of a linear fiber assembly with a single pair of electrode sets on diametrically opposed sides of an optical fiber, according to one or more embodiments.

FIG. 3A depicts a diagrammatic side view of a linear fiber assembly 306a with a single pair of electrode sets 302a-302b on diametrically opposed sides of optical fiber 304 and that alternate positive and negative electrode 307a, 307b. Wavelength agility can be achieved by activating and deactivating all of the positive and negative electrode 307a, 307b. In one or more embodiments, a periodic subset of the positive and negative electrode 307a, 307b is activated and deactivated to perform wavelength agility.

Figure 3B:
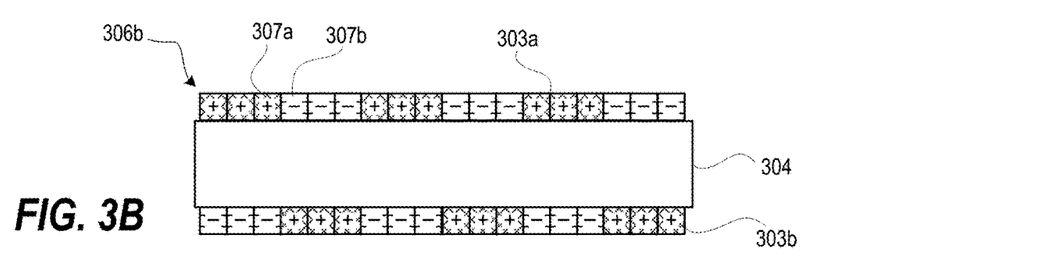
FIG. 3B depicts a diagrammatic side view of a linear fiber assembly with periodic groupings of three (3) positive electrodes and periodic grouping of three (3) negative electrodes, according to one or more embodiments.

FIG. 3B depicts a diagrammatic side view of a linear fiber assembly 306b with a single pair of electrode sets 303a-303b on diametrically opposed sides of optical fiber 304 and that repeatedly alternate in a grouping of three (3) positive electrodes 307a and a grouping of three (3) negative electrode 307307b. Wavelength agility can be achieved by activating and deactivating all of the grouped positive and negative electrode 307a, 307b. In one or more embodiments, the positive and negative electrode 307a, 307b are dynamically reconfigurable into a different number (e.g., 1, 2, 3, 4, etc.) of repeated groupings of positive and negative electrode 307a, 307b to perform wavelength agility.

Figure 3C:
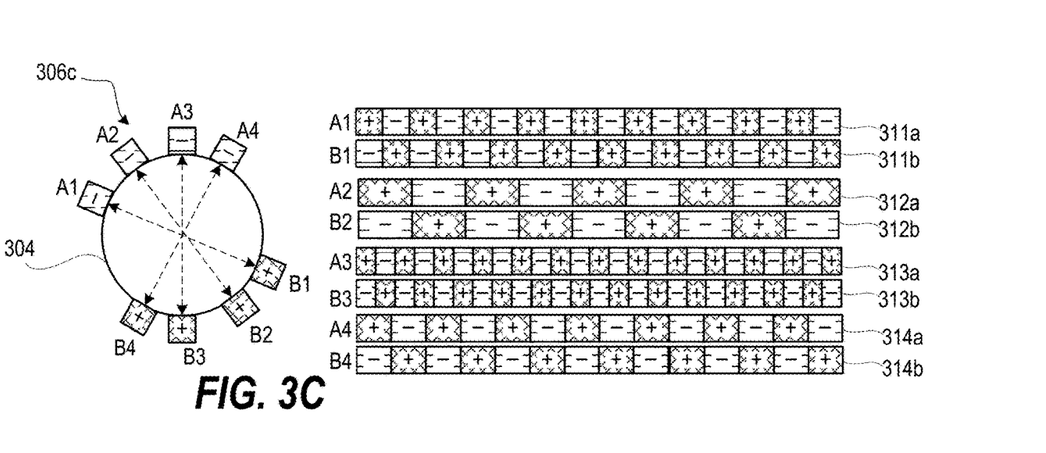
FIG. 3C depicts a cross sectional diagrammatic side view of a linear fiber assembly with four selectable pairs of electrode sets, according to one or more embodiments.

FIG. 3C depicts a cross sectional diagrammatic side view of a linear fiber assembly 306c with four selectable pairs of electrode sets 311a-311b, 312a-312b, 313a-313b, and 314a-314b, that alternate positive and negative electrode 307a, 307b. Each electrode set 311a-311b, 312a-312b, 313a-313b, and 314a-314b are diametrically opposed to the corresponding other electrode set 311a-311b, 312a-312b, 313a-313b, and 314a-314b of the pair. Each electrode set 311a-311b, 312a-312b, 313a-313b, and 314a-314b is at different radial positions to other electrode set 311a-311b, 312a-312b, 313a-313b, and 314a-314b. Wavelength agility can be achieved by activating one of the four pairs of electrode sets 311a-311b, 312a-312b, 313a-313b, and 314a-314b that has respectively a different period of positive and negative electrode 307a, 307b from other pairs. The first pair of electrode sets 311a-311b ("A1", "B1") has a period that is shorter than the second pair of electrode sets 312a-312b ("A2", "B2"). The third pair of electrode sets 313a-313b ("A3", "B3") has period that is shorter than the first pair of electrode sets 311a-311b ("A1", "B 1"). The fourth pair of electrode sets 314a-314b ("A4", "B4") has period that is longer than the first pair of electrode sets 311a-311b ("A1", "B 1") and that is shorter than the second pair of electrode sets 312a-312b ("A2", "B2").

Figure 3D:
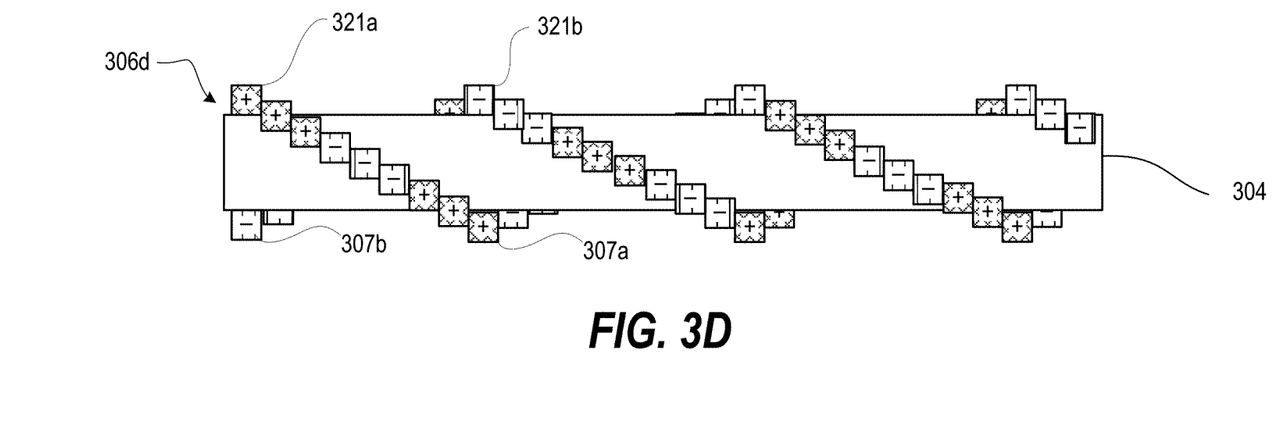
FIG. 3D depicts a side diagrammatic side view of a linear fiber assembly with a single pair of electrode sets that is spiraled around the optical fiber with complementary corresponding positive and negative electrode being diametrically opposed, according to one or more embodiments.

FIG. 3D depicts a side diagrammatic side view of a linear fiber assembly 306d with a single pair of electrode sets 321a-321b that spiral around the optical fiber 304 with complementary corresponding positive and negative electrode 307a, 307b diametrically opposed. The spiral shape can provide a structural benefit and can enable a higher density of electrodes per longitudinal length of fiber.

Figure 4:
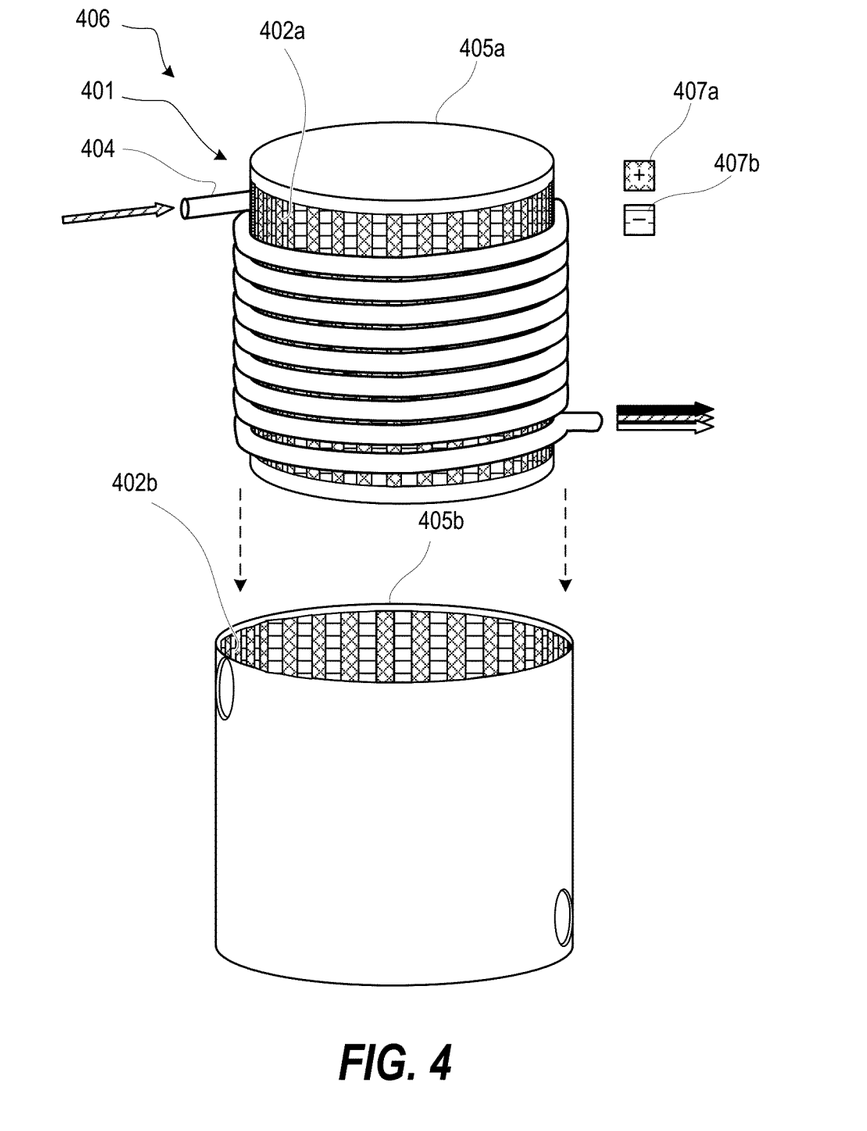
FIG. 4 depicts a three-dimensional, disassembled view of the cylindrical fiber assembly of FIG. 1, according to one or more embodiments.

In one or more embodiments, FIG. 4 depicts cylindrical electrode module 401 that encases a long length of wrapped optical fiber 404 that performs wavelength agility as a cylindrical fiber assembly 406. The cylindrical electrode module 401 includes an inner cylinder 405a that is nested within an outer cylinder 405b. The optical fiber 404 is run through the cylindrical electrode module 401 between the inner and outer cylinders 405a 405b to form the cylindrical fiber assembly 406. An outer surface of the inner cylinder 405a includes an inner periodic electrode set 402a having a repeating pattern of positive and negative electrodes 407a 407b. An inner surface of the outer cylinder 405b includes an outer periodic electrode set 402b having a complementary repeating pattern of positive and negative electrodes 407a 407b to the inner periodic electrode set 402a. The inner and outer periodic electrode set 402a 402b that interact with the long length of the optical fiber 404 to achieve quasi-phase matching.

In one or more embodiments, the optical fiber 404 is gas or liquid filled and thus has a longer poling periods than a solid filled fiber. A longer poling period makes the corresponding larger dimensions of the inner and outer periodic electrode sets 402a-402b, 404a 404b easier to manufacture. For instance Xe at 50 atmospheres has a period of approximately 1 mm whereas fused silica (glass) has a period of approximately 100 μm.

Figure 5:
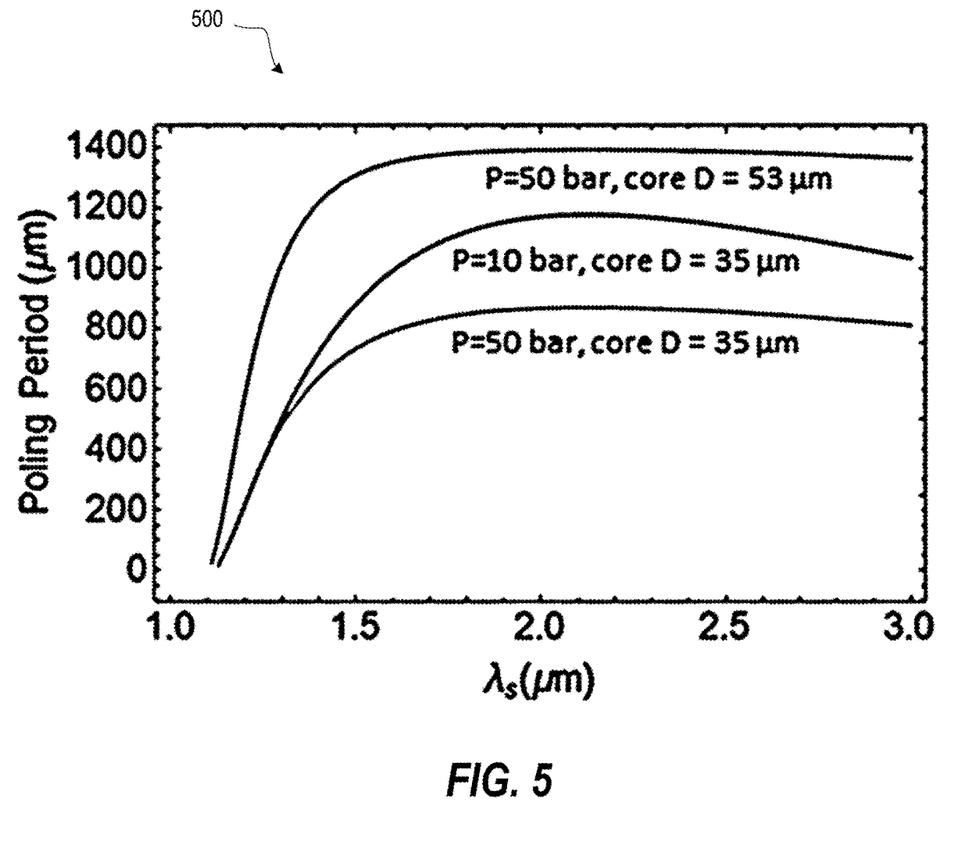
FIG. 5 is a graphical plot of electrode poling period versus signal wavelength for different xenon (Xe) pressures and HCPCF diameters, according to one or more embodiments.
Figure 6:
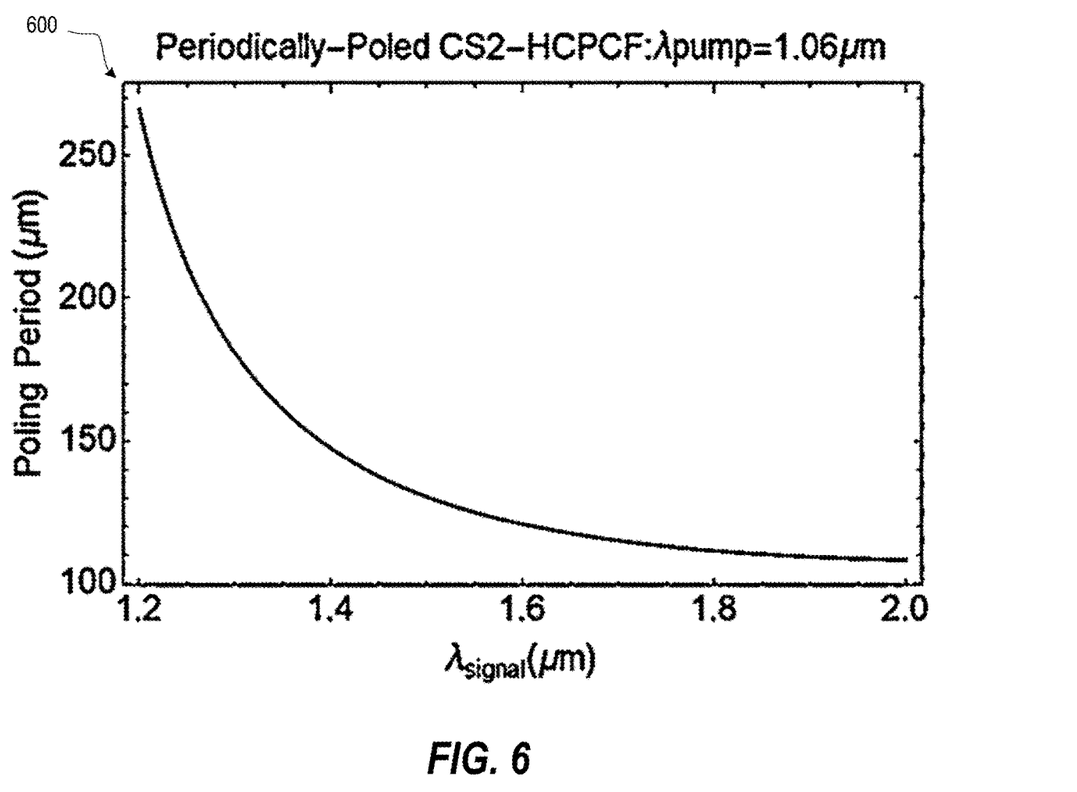
FIG. 6 is a graphical plot for a liquid-filled HCPCF that uses carbon disulfide ($CS_2$), according to one or more embodiments.

Liquid could be used instead of gas. FIG. 5 depicts a graphical plot 500 of electrode poling period versus signal wavelength for different xenon (Xe) pressures and HCPCF diameters. FIG. 6 depicts a graphical plot 600 for a liquid-filled HCPCF that uses carbon disulfide ($CS_2$).

If gas/liquid nonlinearity is too low then conversion efficiency will be low. This could be remedied by placing the periodically poled gas/liquid filled hollow fiber inside of an optical cavity to create an optical parametric oscillator (OPO). OPOs are a common technology for wavelength conversion but are usually constructed from a nonlinear crystal and cavity mirrors.

A significant problem with operation in a material outside of Noble gases (like Xe) is that parasitic processes like Raman scattering can beat out the OPO/OPA channeling the pump energy into unwanted Raman output wavelengths. A solution to this is to introduce significant loss at the Raman wavelength so that the OPA/OPO process can dominate.

The following four (4) references are included in the priority document to the present application and are hereby incorporated by reference in their entirety: (i) http://www.rp-photonics.com/optical_parametric_generators.html; (ii) https://en.wikipedia.org/wiki/Optical_parametric_amplifier; (iii) Quasi-phase matching, David S. Hum *, Martin M. Fejer, C. R. Physique 8 (2007), pp. 180-198; and (iv) Phase-matched electric-field-induced second harmonic generation in Xe-filled hollow-core photonic crystal fiber, JEAN-MICHEL MÉNARD AND PHILIP ST. J. RUSSELL, Vol. 40, No. 15/Aug. 1 2015/Optics Letters 3679. 0146-9592/; and (v) JEAN-MICHEL MÉNARD FELIX KÖTTIG, AND PHILIP ST.J. RUSSELL, Vol. 41, No. 16/Aug. 15 2016/Optics Letters 3795.

In one or more embodiments, the present disclosure provides wavelength flexibility through application of multiple periodic electrode structures. The specific wavelength that is produced depends on which electrode is powered. This process is useful for any nonlinear process that requires phase matching and can be used in gas or liquid filled fibers and fused silica solid core fibers. The latter includes fibers such as telecom fibers.

In one or more embodiments, the present disclosure provides a cylindrical electrode that enables use quasi-phase matching on any type of fibers. This can be for the purpose of creating a specific wavelength or to achieve wavelength agility. The key is that cylindrical electrode enables long interaction length in a practical electrode structure. One aspect of using the term "cylindrical" is associated with producing a number of different periodic electrodes (different periods) and wrapping them around the fiber. By choosing which one is powered, the wavelength produced can be chosen. The second usage of "cylindrical" to implementing single electrode period within cylindrical packaging for reduced length that is more compact and practical. In one or more embodiments, the cylinder electrode could have different periods at different heights to enable use of multiple electrode periods.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

In the preceding detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A cylindrical electrode module for a fiber optic laser system, the cylindrical electrode module comprising:
   an inner cylinder having an inner repeating pattern of longitudinally-aligned positive and negative electrodes on an outer surface of the inner cylinder;
   an outer cylinder that encloses the inner cylinder and that has an outer repeating pattern of longitudinally-aligned negative and positive electrodes on an inner surface of the inner cylinder that are in corresponding and complementary, parallel alignment with the positive and negative electrodes of the inner repeating pattern on the outer surface of the inner cylinder; and
   an optical fiber having: (i) an output end; and (ii) an input end configured to align with and be optically coupled to a high power pump laser, the optical fiber wrapped around the inner cylinder within the outer cylinder to form a cylindrical fiber assembly, the output end extending out of the outer cylinder, wherein the electrodes are activated to achieve quasi-phase matching.

2. A fiber laser system comprising:
   a high power pump laser;
   a cylindrical electrode module module comprising:
      an inner cylinder having an inner repeating pattern of longitudinally-aligned positive and negative electrodes on an outer surface of the inner cylinder,
      an outer cylinder that encloses the inner cylinder and that has an outer repeating pattern of longitudinally-aligned negative and positive electrodes on an inner surface of the inner cylinder that are in corresponding and complementary, parallel alignment with the positive and negative electrodes of the inner repeating pattern on the outer surface of the inner cylinder,
      an optical fiber having: (i) an output end; and (ii) an input end aligned with and optically coupled to the high power pump laser, the optical fiber wrapped around the inner cylinder within the outer cylinder to form a cylindrical fiber assembly, the output end extending out of the outer cylinder; and
      a controller communicatively coupled to, and activates, the inner repeating pattern of positive and negative electrodes and the outer repeating pattern of negative and positive electrodes to perform adjustable period poling to achieve quasi-phase matching (QPM) with wavelength agility.

3. The fiber laser system of claim 2, further comprising:
a seed laser that emits one of a seed laser beam at one of a signal wavelength and an idler wavelength; and
an optical combiner that combines the output from the high power pump laser and the seed laser, wherein the fiber laser system is configured as an optical parametric amplifier (OPA).

4. The fiber laser system of claim 2, further comprising two opposing mirrors positioned on opposite axial sides of the optical fiber to form an optical cavity, wherein the fiber laser system is configured as an optical parametric oscillator (OPO).

5. The fiber laser system of claim 2, wherein the optical fiber comprise a nonlinear optical crystal that generates an output containing a signal and an idler, wherein the fiber laser system is configured as an optical parametric generator (OPG).

6. The fiber laser system of claim 2, wherein the controller activates: (i) a periodic first subset of the inner repeating pattern of positive and negative electrodes; and (i) a corresponding periodic second subset of the outer repeating pattern of negative and positive electrodes to dynamically adjust the period poling.

7. The fiber laser system of claim 2, wherein the optical fiber comprises a fused silica solid core fiber.

8. The fiber laser system of claim 2, wherein the optical fiber comprises a hollow-core photonic crystal fiber (HCPCF) that is filled with a fluid.

9. The fiber laser system of claim 8, wherein the fluid comprises a gas.

10. The fiber laser system of claim 9, further comprising an optical attenuator that attenuates at a Raman wavelength to attenuate Raman scattering parasitic process.

11. The fiber laser system of claim 9, wherein the gas comprises a noble gas.

12. The fiber laser system of claim 11, wherein the noble gas is xenon (Xe).

13. The fiber laser system of claim 8, wherein the fluid comprises a liquid.

14. The fiber laser system of claim 2, wherein the controller performs dynamically adjustable period poling of the first pair of periodic electrode structures to achieve QPM with wavelength agility:
in response to a first mode selection, activates the inner repeating pattern of positive and negative electrodes and the outer repeating pattern of negative and positive electrodes to perform dynamically adjustable period poling to achieve a first wavelength of output that is one of signal and idler wavelength; and
in response to a second mode selection, deactivates the inner repeating pattern of positive and negative electrodes and the outer repeating pattern of negative and positive electrodes to achieve a pump wavelength of output.

* * * * *